United States Patent
Ha et al.

(10) Patent No.: US 8,329,539 B2
(45) Date of Patent: Dec. 11, 2012

(54) SEMICONDUCTOR DEVICE HAVING RECESSED GATE ELECTRODE AND METHOD OF FABRICATING THE SAME

(75) Inventors: Dae-Won Ha, Seoul (KR); Kong-Soo Lee, Gyeonggi-do (KR); Sung-Sam Lee, Yongin-si (KR); Sang-Hyun Lee, Seoul (KR); Min-Young Shim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 1048 days.

(21) Appl. No.: 11/429,890

(22) Filed: May 8, 2006

(65) Prior Publication Data

US 2007/0077713 A1    Apr. 5, 2007

(30) Foreign Application Priority Data

Oct. 4, 2005    (KR) .................. 10-2005-0093146

(51) Int. Cl.
*H01L 21/336* (2006.01)
*H01L 21/8242* (2006.01)

(52) U.S. Cl. ........ 438/270; 438/490; 257/327; 257/332; 257/E29.26

(58) Field of Classification Search .................. 257/327, 257/330, 284, 510; 438/268, 270, 589, 327, 438/332
See application file for complete search history.

(56) References Cited

U.S. PATENT DOCUMENTS

| | | | | |
|---|---|---|---|---|
| 4,977,104 A * | 12/1990 | Sawada et al. | ............. | 438/386 |
| 5,770,514 A | 6/1998 | Matsuda et al. | ............. | 438/589 |
| 6,844,591 B1 * | 1/2005 | Tran | ............. | 257/330 |
| 6,939,765 B2 * | 9/2005 | Kim et al. | ............. | 438/259 |
| 7,160,774 B2 * | 1/2007 | Rabkin et al. | ............. | 438/257 |
| 7,160,789 B2 * | 1/2007 | Park | ............. | 438/426 |
| 7,217,623 B2 * | 5/2007 | Kim et al. | ............. | 438/283 |
| 7,247,540 B2 * | 7/2007 | Chung et al. | ............. | 438/279 |
| 2005/0077568 A1 * | 4/2005 | Park et al. | ............. | 257/330 |
| 2006/0017099 A1 * | 1/2006 | Paik | ............. | 257/330 |
| 2006/0128130 A1 * | 6/2006 | Jang et al. | ............. | 438/589 |
| 2006/0197177 A1 * | 9/2006 | Yeom | ............. | 257/510 |
| 2007/0048914 A1 * | 3/2007 | An | ............. | 438/157 |
| 2007/0200169 A1 * | 8/2007 | Kim | ............. | 257/330 |
| 2007/0224763 A1 * | 9/2007 | Fujimoto et al. | ............. | 438/259 |
| 2007/0264771 A1 * | 11/2007 | Ananthan et al. | ............. | 438/243 |
| 2008/0023753 A1 * | 1/2008 | Choi et al. | ............. | 257/327 |

FOREIGN PATENT DOCUMENTS

| | | |
|---|---|---|
| JP | 07-326738 | 12/1995 |
| KR | 10-2001-0045183 | 6/2001 |
| KR | 10-2001-0059984 | 7/2001 |
| KR | 10-2005-0007637 | 1/2005 |
| KR | 1020060075240 | * 4/2006 |

* cited by examiner

*Primary Examiner* — Steve Loke
*Assistant Examiner* — David Goodwin
(74) *Attorney, Agent, or Firm* — ONello & Mello LLP

(57) ABSTRACT

In a semiconductor device having a recessed gate electrode and a method of fabricating the same, a channel trench is formed in a semiconductor substrate by etching the semiconductor substrate. A first semiconductor layer is formed on the semiconductor substrate that fills the channel trench. A second semiconductor layer is formed on the first semiconductor layer, the second semiconductor layer having a lower impurity concentration than the first semiconductor layer.

10 Claims, 5 Drawing Sheets

SEMICONDUCTOR DEVICE HAVING RECESSED GATE ELECTRODE AND METHOD OF FABRICATING THE SAME

This application claims priority to Korean Patent Application No. 2005-0093146, filed Oct. 4, 2005, the disclosure of which is hereby incorporated herein by reference in its entirety.

BACKGROUND OF THE INVENTION

1. Field of the Invention

The present invention relates to a semiconductor device and a method of fabricating the same, and more particularly, to a semiconductor device having a recessed gate electrode and a method of fabricating the same.

2. Description of Related Art

As the integration density of a semiconductor memory device, such as a DRAM device, increases, the planar area occupied by each MOS transistor of the device necessarily decreases. As a result, the channel length of the MOS transistor is reduced, thus causing a short channel effect. In particular, when the short channel effect is generated in an access MOS transistor that is used for a memory cell of the DRAM device, the threshold voltage of the DRAM cell decreases but the leakage current thereof increases, so that the refresh characteristics of the DRAM device may be degraded. Accordingly, a MOS transistor having a recessed gate electrode has been introduced as a MOS transistor that operates to suppress the short channel effect by increasing the gate channel length even in cases where the DRAM device is highly integrated.

A MOS transistor having the recessed gate electrode is fabricated by forming a channel trench in a semiconductor substrate, forming a gate that fills the channel trench, and forming a source and a drain in the silicon substrate on both sides of the gate. During the formation of the gate, a void may be formed in the gate material layer used to fill in the channel trench. When the gate material layer is a lightly doped polysilicon layer, the void can migrate and come into contact with an inner wall of the channel trench during a subsequent annealing process, so that the threshold voltage of the transistor can be caused to drastically increase or the current path of a channel may be entirely cut off.

Meanwhile, a CMOS semiconductor device is a semiconductor device that adopts a CMOS transistor circuit including an NMOS transistor and a PMOS transistor. The CMOS transistor circuit generally consumes less power than an NMOS transistor circuit or a bipolar transistor circuit. A method of fabricating a dual gate electrode to convert all the channel characteristics of the CMOS transistor into surface channel characteristics is proposed in Korean Laid-open Publication No. 2001-0045183. According to Korean Laid-open Publication No. 2001-0045183, a p-well and an n-well are formed adjacent to each other in a substrate in which an isolation layer is to be formed. A gate insulating layer is deposited on the entire surface of the substrate, and an amorphous silicon layer is deposited on the gate insulating layer. N-type impurities are selectively implanted only into the amorphous silicon layer formed on the p-well, while p-type impurities are selectively implanted only into the amorphous silicon layer formed on the n-well. The amorphous silicon layer in which the n- and p-type impurities are implanted is patterned, thereby forming a dual gate electrode. According to the above-described technique, since all the channel characteristics of the NMOS transistor and the PMOS transistor are converted into the surface channel characteristics, the characteristics of both the NMOS transistor and the PMOS transistor can be improved. However, when a cell transistor disposed in a cell region has a recessed gate electrode, n-type impurities cannot be sufficiently implanted into the recessed gate material layer, and thus the characteristics of the cell transistor can be deteriorated and the void is subject to migration, as described above.

In order to enhance the characteristics of the cell transistor having the recessed gate electrode, a method of depositing a polysilicon layer doped with n-type impurities and selectively implanting p-type impurities into a portion of the polysilicon layer corresponding to a PMOS transistor region has been disclosed. However, when the polysilicon layer which is heavily doped with the n-type impurities is deposited in order to enhance the characteristics of the cell transistor and the NMOS transistor, the p-type impurities implanted into the PMOS transistor region cannot counteract the heavily doped n-type impurities. On the other hand, when a polysilicon layer which is lightly doped with n-type impurities is deposited to solve the above-described problem, a poly-depletion effect can occur in an NMOS transistor region. The poly-depletion effect can lead to an increase in the effective thickness of a gate insulating layer, thus causing a variation of the threshold voltage of the transistor. Also, a void may be formed in the recessed gate electrode (i.e., a cell gate electrode) and migrate in a subsequent annealing process as described above.

SUMMARY OF THE INVENTION

Embodiments of the invention provide a semiconductor device having a recessed gate electrode and a method of fabricating the same that can prevent a poly-depletion effect in a CMOS transistor and prevent a void formed in a cell gate electrode from migrating and coming into contact with an inner wall of a channel trench.

In one aspect, the present invention Is directed to a method of fabricating a semiconductor device, comprising: forming a channel trench in a semiconductor substrate by etching the semiconductor substrate; forming a first semiconductor layer on the semiconductor substrate that fills the channel trench; and forming a second semiconductor layer on the first semiconductor layer, the second semiconductor layer having a lower impurity concentration than the first semiconductor layer.

In one embodiment, forming the channel trench comprises forming the channel trench to include: a lower channel trench having an inner wall with a substantially round profile; and an upper channel trench formed on the lower channel trench and having a width that is less than a maximum width of the lower channel trench.

In another embodiment, the first and second semiconductor layers are doped with n-type impurities.

In another embodiment, the first and second semiconductor layers are formed of polysilicon.

In another embodiment, the first semiconductor layer is formed to have an impurity concentration of $1 \times 10^{20}$ atom/$cm^3$ or higher.

In another embodiment, the method further comprises, before forming the first semiconductor layer, forming a gate insulating layer on an inner wall of the channel trench and on a surface of the semiconductor substrate.

In another embodiment, the method further comprises, before forming the first semiconductor layer, forming an interface semiconductor layer to cover the gate insulating layer, wherein the interface semiconductor layer is formed of one of a semiconductor layer having a lower impurity concentration than the first semiconductor layer and an undoped semiconductor layer.

In another embodiment, the interface semiconductor layer is formed of one of a doped polysilicon layer and an undoped polysilicon layer.

In another embodiment, the method further comprises annealing the semiconductor substrate having the second semiconductor layer.

In another embodiment, the method further comprises forming a recessed gate pattern to cover the channel trench by patterning the second semiconductor layer, the first semiconductor layer, and the interface semiconductor layer.

In another embodiment, the method further comprises annealing the semiconductor substrate having the second semiconductor layer.

In another embodiment, the method further comprises forming a recessed gate pattern to cover the channel trench by patterning the second semiconductor layer and the first semiconductor layer.

In another aspect, the present invention is directed to a method of fabricating a semiconductor device, comprising: preparing a semiconductor substrate having a cell region, a first transistor region, and a second transistor region; forming a channel trench by etching the cell region of the semiconductor substrate; forming a first semiconductor layer of a first conductivity type on the semiconductor substrate that fills the channel trench; forming a second semiconductor layer of the first conductivity type on the first semiconductor layer, the second semiconductor layer having a lower impurity concentration than the first semiconductor layer; and implanting impurities of a second conductivity type that is different from the first conductivity type into the first and second semiconductor layers formed in the second transistor region.

In one embodiment, forming the channel trench comprises forming the channel trench to include: a lower channel trench having an inner wall with a substantially round profile; and an upper channel trench disposed on the lower channel trench and having a width that is than a maximum width of the lower channel trench.

In another embodiment, the first conductivity type is an n type, and the second conductivity type is a p type.

In another embodiment, the first and second semiconductor layers are formed of polysilicon.

In another embodiment, the first semiconductor layer is formed to have an impurity concentration of $1 \times 10^{20}$ atom/$cm^3$ or higher.

In another embodiment, the method further comprises, before forming the first semiconductor layer, forming a gate insulating layer on an inner wall of the channel trench and on a surface of the semiconductor substrate.

In another embodiment, the method further comprises, before forming the first semiconductor layer, forming an interface semiconductor layer to cover the gate insulating layer, wherein the interface semiconductor layer is formed of one of a semiconductor layer of the first conductivity type having a lower impurity concentration than the first semiconductor layer and an undoped semiconductor layer.

In another embodiment, the interface semiconductor layer is formed of one of a doped polysilicon layer and an undoped polysilicon layer.

In another embodiment, the method further comprises annealing the semiconductor substrate in which the impurities of the second conductivity type are implanted.

In another embodiment, the method further comprises: after implanting the impurities of the second conductivity type, forming a metal silicide layer on the second semiconductor layer; and forming a cell gate pattern, a first gate pattern, and a second gate pattern by patterning the metal silicide layer, the second semiconductor layer, the first semiconductor layer, wherein the cell gate pattern covers the channel trench and the first and second gate patterns are formed in the first and second transistor regions, respectively.

In another embodiment, the method further comprises annealing the semiconductor substrate in which the impurities of the second conductivity type are implanted.

In another embodiment, the method further comprises: after implanting the impurities of the second conductivity type, forming a metal silicide layer on the second semiconductor layer; and forming a cell gate pattern, a first gate pattern, and a second gate pattern by patterning the metal silicide layer, the second semiconductor layer, and the first semiconductor layer, wherein the cell gate pattern covers the channel trench and the first and second gate patterns are formed in the first and second transistor regions, respectively.

In another aspect, the present invention is directed to a semiconductor device comprising: a semiconductor substrate; a channel trench in the semiconductor substrate; a lower semiconductor layer pattern of a first conductivity type that fills the channel trench; and an upper semiconductor layer pattern on the lower semiconductor layer pattern across the channel trench, wherein the upper semiconductor layer pattern has the first conductivity type and has a lower impurity concentration than an impurity concentration of the lower semiconductor layer pattern.

In one embodiment, the channel trench includes: a lower channel trench having an inner wall with a substantially round profile; and an upper channel trench on the lower channel trench and having a width that is less than a maximum width of the lower channel trench.

In another embodiment, the first conductivity type is an n type.

In another embodiment, each of the lower and upper semiconductor patterns is a polysilicon layer pattern.

In another embodiment, the device further comprises a gate insulating layer covering an inner wall of the channel trench.

In another embodiment, the device further comprises a metal silicide layer pattern on the upper semiconductor layer pattern.

In another embodiment, the device further comprises a first gate pattern and a second gate pattern which are on the semiconductor substrate and electrically insulated from the semiconductor substrate.

In another embodiment, the first gate pattern includes: a semiconductor layer pattern on the semiconductor substrate and having the first conductivity type; and a metal silicide layer pattern on the semiconductor layer pattern, the semiconductor layer pattern having substantially the same impurity concentration as the upper semiconductor layer pattern.

In another embodiment, the second gate pattern includes: a semiconductor layer pattern on the semiconductor substrate and having a second conductivity type that is different from the first conductivity type; and a metal silicide layer pattern disposed on the semiconductor layer pattern.

In another embodiment, the first and second conductivity types are an n type and a p type, respectively.

BRIEF DESCRIPTION OF THE DRAWINGS

The foregoing and other objects, features and advantages of the invention will be apparent from the more particular description of exemplary embodiments of the invention, as illustrated in the accompanying drawings. The drawings are not necessarily to scale, emphasis instead being placed upon illustrating the principles of the invention.

DETAILED DESCRIPTION OF EMBODIMENTS OF THE INVENTION

Figure 1:
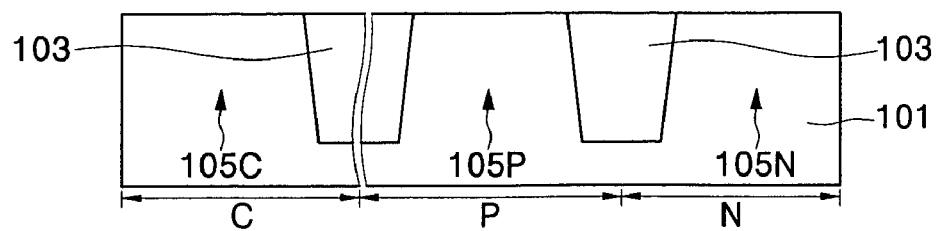
FIGS. 1 through 9 are cross-sectional views illustrating a method of fabricating a semiconductor device having a recessed gate electrode according to exemplary embodiments of the present invention.

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete. In the drawings and related specification, if a first layer is referred to as being "on" another layer, the first layer can be directly on the other layer, or intervening layers may be present. In the drawings, the thicknesses of layers and regions are exaggerated for clarity. The same reference numerals are used to denote the same elements.

FIGS. 1 through 9 are cross-sectional views illustrating a method of fabricating a semiconductor device having a recessed gate electrode according to exemplary embodiments of the present invention.

Referring to FIG. 1, a semiconductor substrate 101 having a cell region C and a peripheral circuit region is provided. The peripheral circuit region may include a first transistor region N and a second transistor region P. The first and second transistor regions N and P may correspond to an NMOS transistor region and a PMOS transistor region, respectively. An isolation layer 103 is formed in the semiconductor substrate 101 having the cell region C, the NMOS transistor region N, and the PMOS transistor region P. The isolation layer 103 may be formed by, for example, a shallow trench isolation (STI) process. A cell active region 105C, an NMOS active region 105N, and a PMOS active region 105P are defined by the isolation layers 103 in the cell region C, the NMOS transistor region N, and the PMOS transistor region P, respectively. A p-well (not shown) may be formed in the cell region C and the NMOS transistor region N of the semiconductor substrate 101, and an n-well (not shown) may be formed in the PMOS transistor region P of the semiconductor substrate 101. The p- and n-wells may be formed before or after the isolation layer 103 is formed.

Figure 2:
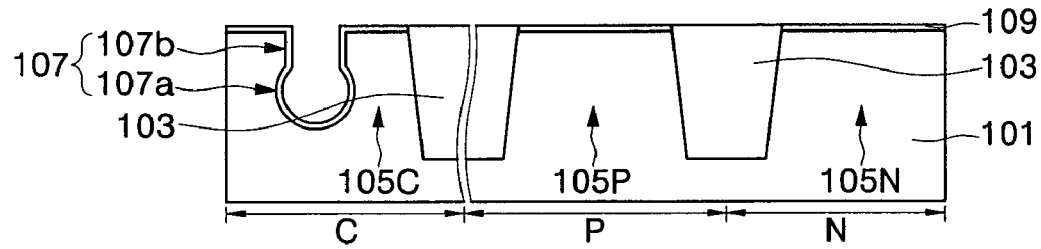

Referring to FIG. 2, a channel trench 107 is formed across the cell active region 105C. The channel trench 107 may be formed by forming a patterned mask layer on the semiconductor substrate 101 and then etching the cell active region 105C using the mask layer as an etch mask. The channel trench 107 may include a lower channel trench 107*a* of which an inner wall has a substantially round profile, and an upper channel trench 107*b* disposed on the lower channel trench 107*a* and having a width that is less than the maximum width of the lower channel trench 107*a*. The formation of the channel trench 107 may, for example, include forming the upper channel trench 107*b* using the patterned mask layer as an etch mask. Thereafter, a spacer may be formed on a sidewall of the upper channel trench 107*b*. A bottom surface of the upper channel trench 107 may be isotropically etched to form the lower channel trench 107*a* with the substantially round inner wall profile. The formation of the channel trench 107 is not limited to the above description. After the channel trench 107 is formed, the mask layer is removed.

A gate insulating layer 109 is formed on the entire surface of the semiconductor substrate 101 having the channel trench 107. Specifically, the gate insulating layer 109 may be formed on an inner wall of the channel trench 107 and a surface of the semiconductor substrate 101. The gate insulating layer 109 may be formed by a thermal oxidation process.

Figure 3:
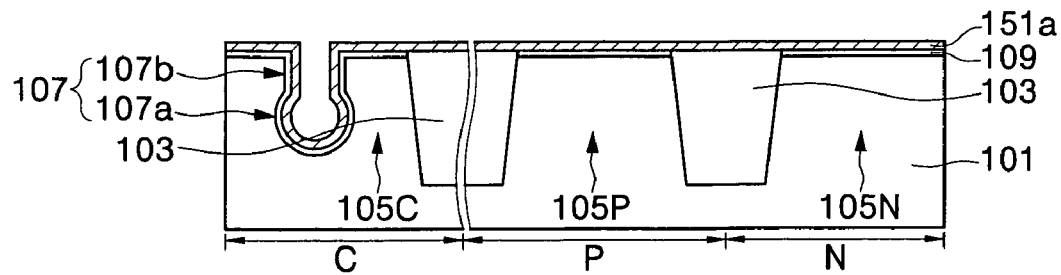

Referring to FIG. 3, an interface semiconductor layer (e.g., an interface polysilicon layer 151*a*) is formed on the gate insulating layer 109. The interface polysilicon layer 151*a* may be formed to cover the inner wall of the channel trench 107 on which the gate insulating layer 109 is formed. The interface polysilicon layer 151*a* may be formed to a thickness less than ½ the width of the upper channel trench 107*b*. That is, the interface polysilicon layer 151*a* may be formed to a thickness that corresponds to less than ½ the width of the upper channel trench 107*b*, so that an opening of the channel trench 107 is not blocked, and therefore, the gate insulating layer 109 of both the upper and lower channel trenches 107*b*, 107*a* can be conformably coated by the interface polysilicon layer 151*a* in one embodiment, the interface polysilicon layer 151*a* is formed to a thickness of about 100 Å or less. The interface polysilicon layer 151*a* may be doped with n-type impurities at a lower impurity concentration than a first polysilicon layer that is to be subsequently formed. Alternatively, the interface polysilicon layer 151*a* may be an undoped polysilicon layer. The interface polysilicon layer 151*a* may be deposited using a silicon source gas and a dopant source gas as a process gas. When the interface polysilicon layer 151 is the undoped polysilicon layer, the dopant source gas is not supplied.

By forming the interface polysilicon layer 151*a* on the gate insulating layer 109, the mobility of carriers can increase, and thus a larger current can flow through the channel region. Also, the interface polysilicon layer 151*a* operates to prevent the gate insulating layer 109 from being deteriorated due to the diffusion of the impurities.

The formation of the interface polysilicon layer 151*a* is optional, and in another embodiment, may be omitted.

Figure 4:
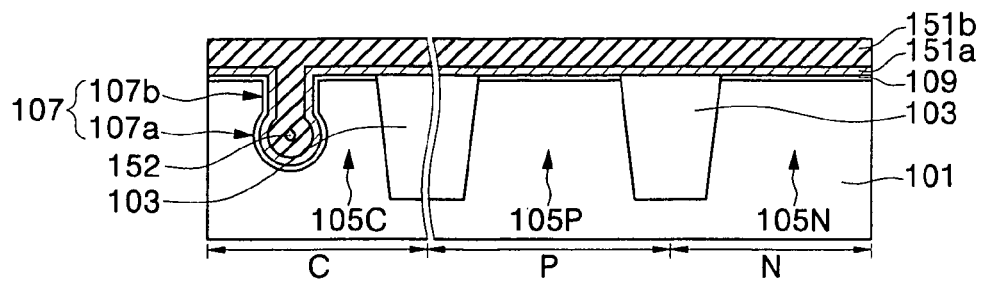

Referring to FIG. 4, a first semiconductor layer of a first conductivity type (e.g., a first polysilicon layer 151*b* doped with n-type impurities) is formed on the interface polysilicon layer 151*a* to fill the channel trench 107. In one embodiment, the n-type impurities are phosphorus (P) ions or arsenic (As) ions. The first polysilicon layer 151*b* may be deposited using a silicon source gas and a dopant source gas as a process gas. The impurity concentration of the first polysilicon layer 151*b* may be controlled by regulating the injection amount of the dopant source gas.

The first polysilicon layer 151*b* is formed to such a thickness as to fill the upper channel trench 107*b*. That is, the first polysilicon layer 151*b* may be deposited to a thickness greater than ½ the width of the upper channel trench 107*b*. For example, when the width of the upper channel trench 107*b* is less than 600 Å, the first polysilicon layer 151*b* may be deposited to a thickness of 300 to 400 Å. In this case, it is possible that a void 152 may be formed in the lower channel trench 107*a* because the width of the lower channel trench 107*a* is greater than that of the upper channel trench 107*b*. The first polysilicon layer 151*b* may be formed to fill the upper channel trench 107*b* and cover an inner wall of the lower channel trench 107*a* while leaving the void 152 in the center of the lower channel trench 107*a*. The deposited thickness of the first polysilicon layer 151*b* may be controlled by regulating the process time. The first polysilicon layer 151*b* may be deposited in-situ without vacuum break after the interface polysilicon layer 151*a* is formed.

The first polysilicon layer 151b is formed to have a higher impurity concentration than that of the interface polysilicon layer 151a. For instance, the first polysilicon layer 151b may be formed to have an impurity concentration of $1\times10^{20}$ atom/cm$^3$ or higher. When the impurity concentration of the first polysilicon layer 151b is low, the void 152 in the lower channel trench 107a is more likely to migrate and come into contact with the inner wall of the lower channel trench 107a in a subsequent annealing process. As a result, the threshold voltage may increase and the current path of a channel can be entirely cutoff. To prevent these problems, the first polysilicon layer 151b should be formed to have a high impurity concentration. The impurity concentration of the first polysilicon layer 151b may be elevated by increasing the injection amount of the dopant source gas.

In an embodiment where the interface polysilicon layer 151a is present, the first polysilicon layer 151b may be formed at a higher impurity concentration than when the formation of the interface polysilicon layer 151a is omitted. This is because when the interface polysilicon layer 151a is formed, the impurity concentration of the first polysilicon layer 151b in the channel trench 107 may be lowered due to the diffusion of impurities into the interface polysilicon layer 151a.

Figure 5:
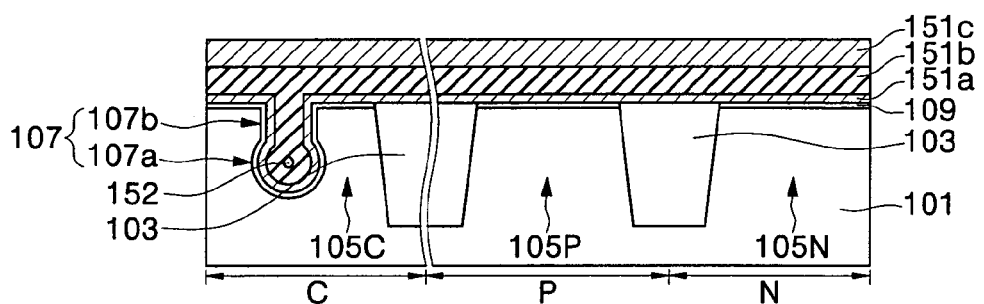

Referring to FIG. 5, a second semiconductor layer of the first conductivity type (e.g., a second polysilicon layer 151c doped with n-type impurities) is formed on the first polysilicon layer 151b. The second polysilicon layer 151c is formed to have a lower impurity concentration than that of the first polysilicon layer 151b. For example, the second polysilicon layer 151c may be formed to have an impurity concentration of $1\times10^{20}$ atom/cm$^3$ or less. Like the first polysilicon layer 151b, the second polysilicon layer 151c may be deposited using a silicon source gas and a dopant source gas as a process gas. The second polysilicon layer 151c may be deposited in-situ without vacuum break after the first polysilicon layer 151b is formed. In this case, by reducing the injection amount of the dopant source gas, the impurity concentration of the second polysilicon layer 151c may be lower than that of the first polysilicon layer 151b. The second polysilicon layer 151c may be formed to a thickness of about 700 to 800 Å. Thereafter, the second polysilicon layer 151c is planarized.

In the present invention, the channel trench 107 is filled with the first polysilicon layer 151b that is heavily doped with n-type impurities, thus preventing the void 152 from migrating in a subsequent annealing process. Also, since the second polysilicon layer 151c having a lower impurity concentration than that of the first polysilicon layer 151b is formed on the first polysilicon layer 151b, the interface polysilicon layer 151a and the first and second polysilicon layers 151b and 151c that are formed in the PMOS transistor region P may be doped with p-type impurities to counteract the n-type impurities, so that the polysilicon layers can have p-type conductivity.

Figure 10:
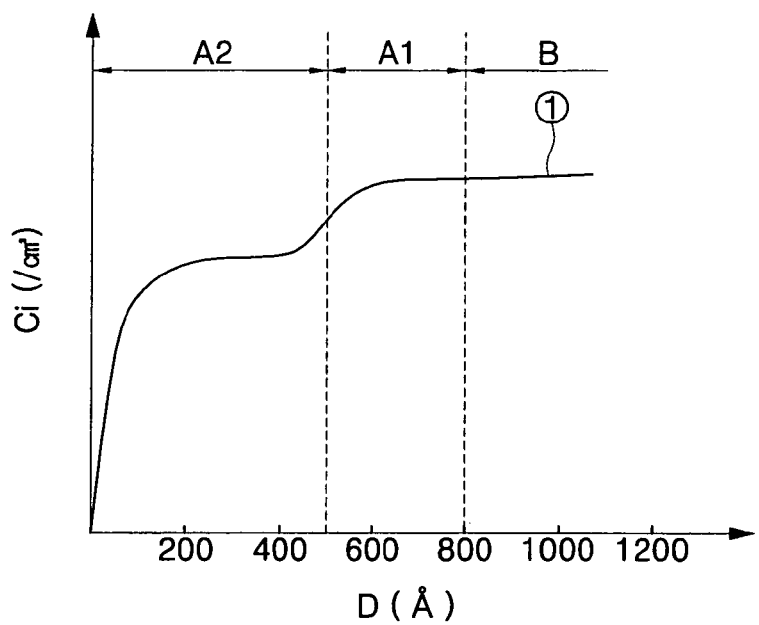
FIGS. 10 and 11 are graphs showing the profiles of impurity concentration in a semiconductor layer, in accordance with the present invention.

FIG. 10 is a graph showing an example of a profile of the impurity concentration of the first and second polysilicon layers 151b and 151c. In FIG. 10, the abscissa denotes the depth D measured from the top surface of the second polysilicon layer 151c to the gate insulating layer 109 formed in the channel trench 107, and the ordinate denotes impurity concentration Ci.

Referring to FIG. 5 and FIG. 10, when the first polysilicon layer 151b is formed on the semiconductor substrate 101 to a thickness of about 300 Å and the second polysilicon layer 151c is formed to a thickness of about 500 Å, the profile of the impurity concentration Ci is according to curve 1. In FIG. 10, section A1 represents the profile of the impurity concentration Ci of the first polysilicon layer 151b, and section A2 represents the profile of the impurity concentration Ci of the second polysilicon layer 151c. Also, section B represents the profile of the impurity concentration Ci of the first polysilicon layer 151b formed in the channel trench 107. As can be seen from the curve 1, the first polysilicon layer 151b is formed to have a higher impurity concentration Ci than the second polysilicon layer 151c. The first and second polysilicon layers 151b and 151c may be formed in-situ by injecting a silicon source gas and a dopant source gas into a furnace. In this case, the impurity concentrations Ci may be controlled by regulating the injection amount of the dopant source gas.

Figure 6:
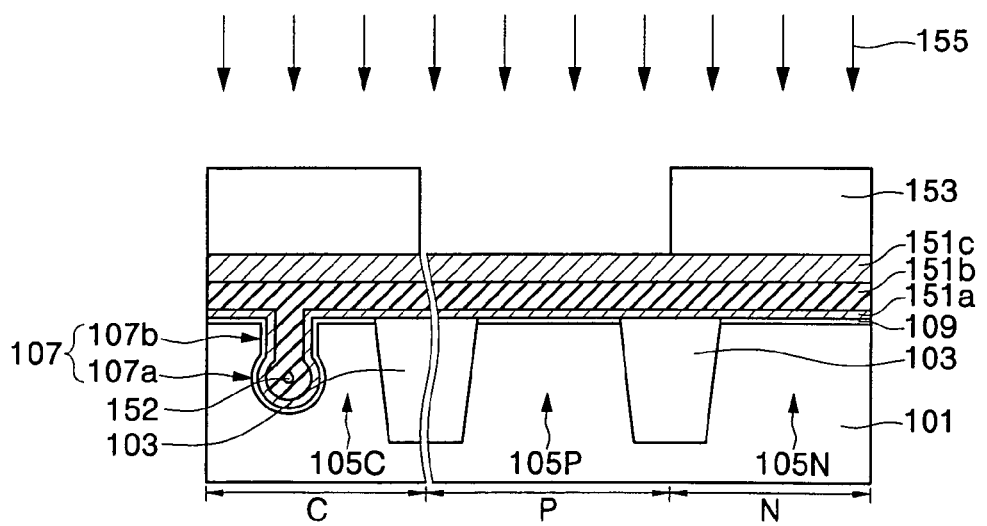

Referring to FIG. 6, a mask layer pattern 153 is formed on the second polysilicon layer 151c to expose the PMOS transistor region P. The mask layer pattern 153 comprises, for example, a photoresist layer pattern. P-type impurities 155 are implanted into the interface polysilicon layer 151a and the first and second polysilicon layers 151b and 151c which are formed in the PMOS transistor region P using the mask layer pattern 153 as an ion implantation mask. The p-type impurities 155 may be B ions or BF$_2$ ions. The p-type impurities 155 may be implanted, for example, by an ion implantation process or a plasma doping process. Thereafter, the mask layer pattern 153 is removed.

According to the present invention, in order to prevent the migration of the void 152 in the channel trench 107, the first polysilicon layer 151b that is heavily doped with the n-type impurities is formed to such a thickness as to fill the channel trench 107. Also, the second polysilicon layer 151c that is lightly doped with the n-type impurities is formed on the first polysilicon layer 151b. Thus, the n-type impurities doped in the PMOS transistor region P are counteracted by the p-type impurities 155, so that the entire polysilicon layer can have p-type conductivity.

Figure 7:
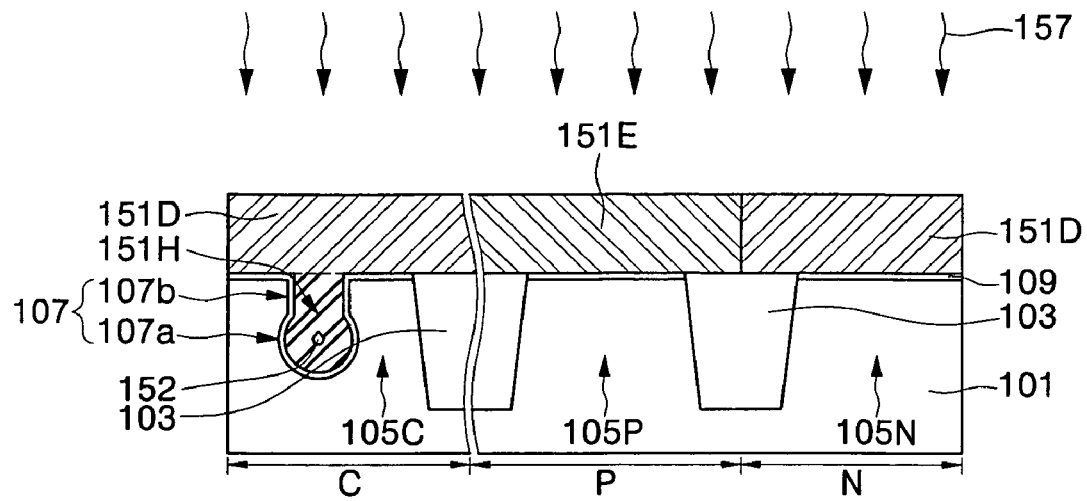

Referring to FIG. 7, an annealing process 157 is performed on the semiconductor substrate 101 that is doped with the p-type impurities 155. During the annealing process 157, impurities in the first polysilicon layer 151b formed in the cell region C and the NMOS transistor region N diffuse into the second polysilicon layer 151c, thereby forming an annealed n-type polysilicon layer 151D. In this case, the impurities that diffuse into the second polysilicon layer 151c are provided from the first polysilicon layer 151b adjacent to an interface between the second polysilicon layer 151c and the first polysilicon layer 151b. Thus, impurities in the annealed polysilicon layer 151H formed in the channel trench 107 diffuse to a lesser degree. Therefore, the annealed polysilicon layer 151H formed in the channel trench 107 may have a higher impurity concentration than the annealed n-type polysilicon layer 151D formed on the channel trench 107. After the annealing process 157 is performed, the annealed n-type polysilicon layer 151D formed on the channel trench 107 becomes an upper polysilicon layer 151D, and the annealed polysilicon layer 151H, which is formed in the channel trench 107 and has a higher impurity concentration than the upper polysilicon layer 151D, becomes a lower polysilicon layer 151H. During the annealing process 157, the p-type impurities 155 implanted in the PMOS transistor region P also diffuse to form an annealed p-type polysilicon layer 151E in the PMOS transistor region P. In one embodiment, the annealing process 157 comprises a rapid thermal annealing (RTA) process.

Figure 11:
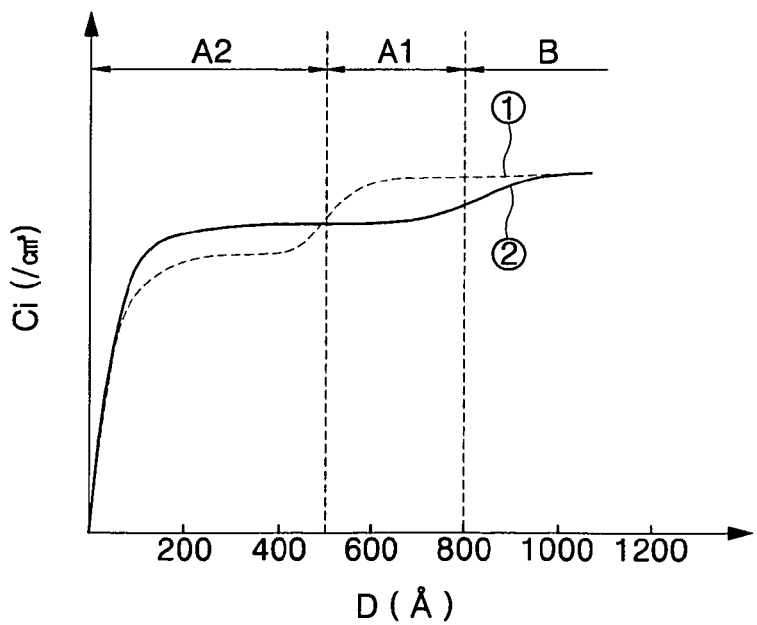

FIG. 11 is a graph showing an example profile of the impurity concentrations of the first and second polysilicon layers 151b and 151c before and after the annealing process 157.

Referring to FIG. 7 and FIG. 11, the curve 1 obtained before the annealing process 157 is changed to a curve 2 after the annealing process 157. In FIG. 11, sections A2 and A1 represent the profile of the impurity concentration Ci of the upper polysilicon layer 151D formed by diffusing the impurities in the first polysilicon layer 151b into the second polysilicon layer 151c during the annealing process 157. Also, section B represents the profile of the impurity concentration Ci of the lower polysilicon layer 151H in the channel trench 107 after the annealing process 157. As can be seen from the curve 2, the lower polysilicon layer 151H in the section B has a higher impurity concentration than the upper polysilicon layer 151D. This is because the impurities in the first polysilicon layer 151b diffuse to a larger degree closer to the interface between the first and second polysilicon layers 151b and 151c than farther away from the interface during the annealing process 157. As a result, the lower polysilicon layer 151H formed in the channel trench 107 maintains a high impurity concentration, even after the annealing process 157 is performed. Accordingly, the migration of the void 152 in the lower polysilicon layer 151H can be mitigated or entirely prevented.

Figure 8:
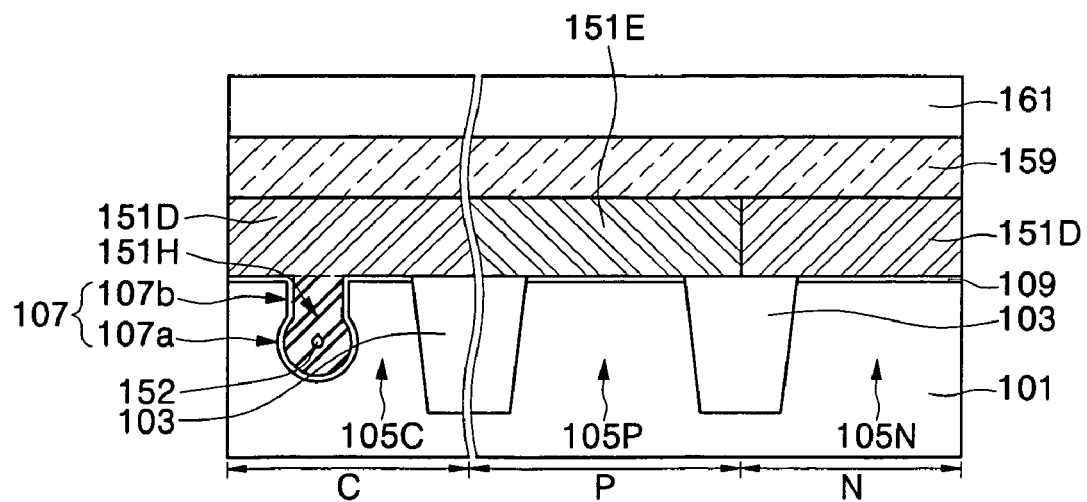

Referring to FIG. 8, a metal silicide layer 159 may be formed on the annealed n-type polysilicon layer 151D and the annealed p-type polysilicon layer 151E. In one embodiment, the metal silicide layer 159 comprises a tungsten silicide layer. A gate capping layer 161 may be formed on the metal silicide layer 159. The gate capping layer 161 comprises, for example, a silicon oxide layer or a silicon nitride layer. The annealing process 157 described with reference to FIG. 7 may optionally be performed after the gate capping layer 161 is formed.

Figure 9:
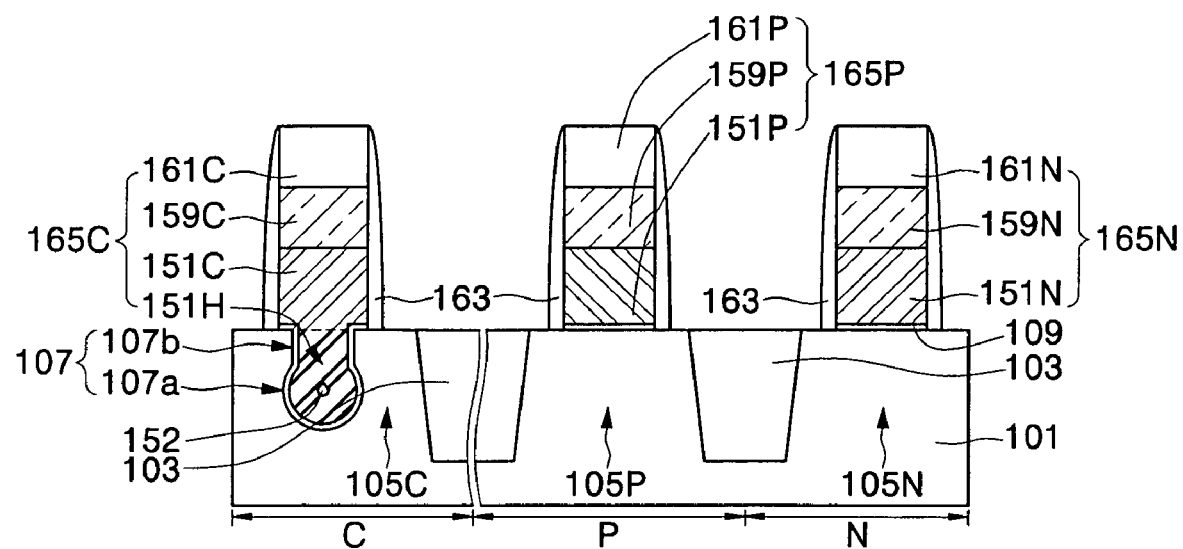

Referring to FIG. 9, the gate capping layer 161, the metal silicide layer 159, the annealed n-type polysilicon layer 151D, and the annealed p-type polysilicon layer 151E are patterned, thereby forming a recessed gate pattern (i.e., a cell gate pattern 165C), a first gate pattern 165N, and a second gate pattern 165P in the cell region C, the NMOS transistor region N, and the PMOS transistor region P, respectively. The cell gate pattern 165C includes a lower polysilicon layer pattern 151H, an annealed n-type polysilicon layer pattern 151C, a metal silicide layer pattern 159C, and a gate capping layer pattern 161C, which are stacked. The first gate pattern 165N includes an annealed n-type polysilicon layer pattern 151N, a metal silicide layer pattern 159N, and a gate capping layer pattern 161N, which are stacked. Also, the second gate pattern 165P includes an annealed p-type polysilicon layer pattern 151P, a metal silicide layer pattern 159P, and a gate capping layer pattern 161P, which are stacked. The cell gate pattern 165C fills the channel trench 107 and traverses the cell active region 105C. The first and second gate patterns 165N and 165P are formed across the NMOS active region 105N and the PMOS active region 105P, respectively. A spacer 163 may be additionally formed on sidewalls of the cell gate pattern 165C, the first gate pattern 165N, and the second gate pattern 165P.

The structure of a semiconductor device having a recessed gate electrode according to an exemplary embodiment of the present invention will now be described with reference to FIG. 9.

Referring to FIG. 9, a first semiconductor substrate 101 having a cell region C, a first transistor region N, and a second transistor region P is provided. The first and second transistor regions N and P may be an NMOS transistor region and a PMOS transistor region P, respectively. An isolation layer 103 is disposed in the semiconductor substrate 101 to define a cell active region 105C, an NMOS active region 105N, and a PMOS active region 105P in the cell region C, the NMOS transistor region N, and the PMOS transistor region P, respectively. A channel trench 107 is disposed across the cell active region 105C of the cell region C. The channel trench 107 may include a lower channel trench 107a and an upper channel trench 107b. An inner wall of the lower channel trench 107a has a substantially round profile, and the upper channel trench 107b is disposed on the lower channel trench 107a and has a smaller width than the maximum width of the lower channel trench 107a. The inner wall of the lower channel trench 107a and a sidewall of the upper channel trench 107b are covered with a gate insulating layer 109.

A lower polysilicon layer pattern 151H of a first conductivity type fills the channel trench 107 that is surrounded by the gate insulating layer 109. A void 152 may be disposed in the lower polysilicon layer pattern 151H. An upper polysilicon layer pattern 151C of the first conductivity type is disposed on the lower polysilicon layer pattern 151H across the cell active region 105C. The first conductivity type may be an n type. In one embodiment, the lower polysilicon layer pattern 151H is doped with n-type impurities at a concentration that is higher than the impurity concentration of the upper polysilicon layer pattern 151C. A metal silicide layer pattern 159C is disposed on the upper polysilicon layer pattern 151C. The metal silicide layer pattern 159C may be a tungsten silicide layer pattern. A gate capping layer pattern 161C may be disposed on the metal silicide layer pattern 159C. A spacer 163 may be disposed on sidewalls of the upper polysilicon layer pattern 151C, the metal silicide layer pattern 159C, and the gate capping layer pattern 161C.

A first gate pattern 165N and a second gate pattern 165P are disposed on the NMOS active region 105N and the PMOS active region 105P, respectively. The first gate pattern 165N includes a semiconductor layer pattern of the first conductivity type (i.e., an n-type polysilicon layer pattern 151N), a metal silicide layer pattern 159N, and a gate capping layer pattern 161N, which are stacked. The spacer 163 may be disposed on sidewalls of the n-type polysilicon layer pattern 151N, the metal silicide layer pattern 159N, and the gate capping layer pattern 161N. The n-type polysilicon layer pattern 151N may be doped with n-type impurities having substantially the same concentration as the upper polysilicon layer pattern 151C formed in the cell region C. The first gate pattern 165N is electrically insulated from the NMOS active region 105N by the gate insulating layer 109.

The second gate pattern 165P includes a semiconductor layer pattern of a second conductivity type that is different from the first conductivity type (i.e., a p-type polysilicon layer pattern 151P), a metal silicide layer pattern 159P, and a gate capping layer pattern 161P, which are stacked. The spacer 163 may be disposed on sidewalls of the p-type polysilicon layer pattern 151P, the metal silicide layer pattern 159P, and the gate capping layer pattern 161P. The second gate pattern 165P is electrically insulated from the PMOS active region 105P by the gate insulating layer 109.

As described above, the methods and devices of the present invention operate to suppress a poly-depletion effect in a CMOS transistor and operate to prevent the migration of a void formed in a cell gate electrode.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a semiconductor device, comprising:

preparing a semiconductor substrate having a cell region, a first transistor region, and a second transistor region;

forming a channel trench by etching the cell region of the semiconductor substrate, wherein forming the channel trench comprises forming the channel trench to include a lower channel trench having an inner wall with a substantially round profile, wherein a portion of the lower channel trench above a widest portion of the lower channel trench has the substantially round profile;

forming a first semiconductor layer of a first conductivity type on the semiconductor substrate that fills the channel trench;

forming a second semiconductor layer of the first conductivity type on the first semiconductor layer, the second semiconductor layer having a lower impurity concentration than the first semiconductor layer;

implanting impurities of a second conductivity type that is different from the first conductivity type into the first and second semiconductor layers formed in the second transistor region;

before forming the first semiconductor layer, forming a gate insulating layer on an inner wall of the channel trench and on a surface of the semiconductor substrate;

before forming the first semiconductor layer, forming an interface semiconductor layer to cover the gate insulating layer, wherein the interface semiconductor layer is formed of one of a semiconductor layer of the first conductivity type having a lower impurity concentration than the first semiconductor layer and an undoped semiconductor layer; and after implanting the impurities of the second conductivity type,
  forming a metal silicide layer on the second semiconductor layer; and
  forming a cell gate pattern, a first gate pattern, and a second gate pattern by patterning the metal silicide layer, the second semiconductor layer, the first semiconductor layer, and the interface semiconductor layer,
  wherein the cell gate pattern covers the channel trench and the first and second gate patterns are formed in the first and second transistor regions, respectively.

2. The method according to claim 1, wherein forming the channel trench comprises forming the channel trench to include an upper channel trench disposed on the lower channel trench and having a width that is less than a maximum width of the lower channel trench.

3. The method according to claim 1, wherein the first conductivity type is an n type, and the second conductivity type is a p type.

4. The method according to claim 1, wherein the first and second semiconductor layers are formed of polysilicon.

5. The method according to claim 1, wherein the first semiconductor layer is formed to have an impurity concentration of $1 \times 10^{20}$ atom/cm$^3$ or higher.

6. The method according to claim 1, wherein the interface semiconductor layer is formed of one of a doped polysilicon layer and an undoped polysilicon layer.

7. The method according to claim 1, further comprising annealing the semiconductor substrate having the first and second semiconductor layers in which the impurities of the second conductivity type are implanted.

8. A method of fabricating a semiconductor device, comprising:

preparing a semiconductor substrate having a cell region, a first transistor region, and a second transistor region;

forming a channel trench by etching the cell region of the semiconductor substrate, wherein forming the channel trench comprises forming the channel trench to include a lower channel trench having an inner sidewall with a substantially round profile and an upper channel trench on the lower channel trench, wherein a portion of the lower channel trench above a widest portion of the lower channel trench has the substantially round profile;

forming a first semiconductor layer of a first conductivity type on the semiconductor substrate that fills the channel trench;

forming a second semiconductor layer of the first conductivity type on the first semiconductor layer, the second semiconductor layer having a lower impurity concentration than the first semiconductor layer; and implanting impurities of a second conductivity type that is different from the first conductivity type into the first and second semiconductor layers formed in the second transistor region;

before forming the first semiconductor layer, forming a gate insulating layer on an inner wall of the channel trench and on a surface of the semiconductor substrate;

before forming the first semiconductor layer, forming an interface semiconductor layer to cover the gate insulating layer; and wherein the interface semiconductor layer is formed of one of a semiconductor layer of the first conductivity type having a lower impurity concentration than the first semiconductor layer and an undoped semiconductor layer; and after implanting the impurities of the second conductivity type,
  forming a metal silicide layer on the second semiconductor layer; and
  forming a cell gate pattern, a first gate pattern, and a second gate pattern by patterning the metal silicide layer, the second semiconductor layer, the first semiconductor layer, and the interface semiconductor layer; and
  wherein the cell gate pattern covers the channel trench and the first and second gate patterns are formed in the first and second transistor regions, respectively.

9. The method according to claim 1, wherein a bottom of the second semiconductor layer is disposed exclusively on a top surface of the semiconductor substrate.

10. A method of fabricating a semiconductor device, comprising:

preparing a semiconductor substrate having a cell region, a first transistor region, and a second transistor region;

forming a channel trench by etching the cell region of the semiconductor substrate, wherein forming the channel trench comprises forming the channel trench to include a lower channel trench having an inner wall with a substantially round profile and an upper channel trench on the lower channel trench, the upper channel trench having a vertical inner wall that is perpendicular to a top surface of the semiconductor substrate, wherein a portion of the lower channel trench above a widest portion of the lower channel trench has the substantially round profile;

forming a first semiconductor layer of a first conductivity type on the semiconductor substrate that fills the channel trench;

forming a second semiconductor layer of the first conductivity type on the first semiconductor layer, the second semiconductor layer having a lower impurity concentration than the first semiconductor layer; and implanting impurities of a second conductivity type that is different from the first conductivity type into the first and second semiconductor layers formed in the second transistor region;

forming a cell gate pattern that covers the channel trench in the cell region;

forming a first gate pattern in the first transistor region; and forming a second gate pattern in the second transistor region, wherein the cell gate pattern forms a cell transistor in the cell region of the semiconductor substrate, the first gate pattern forms a first peripheral transistor in the first transistor region of the semiconductor substrate, and the second gate pattern forms a second peripheral transistor in the second transistor region of the semiconductor substrate.

* * * * *